(12) United States Patent
Fukiage

(10) Patent No.: US 6,699,531 B1
(45) Date of Patent: Mar. 2, 2004

(54) PLASMA TREATMENT METHOD

(75) Inventor: Noriaki Fukiage, Tama (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/559,536

(22) Filed: Apr. 28, 2000

Related U.S. Application Data

(63) Continuation of application No. PCT/JP98/04932, filed on Oct. 30, 1998.

(30) Foreign Application Priority Data

Oct. 30, 1997 (JP) .............................. 9-316589

(51) Int. Cl.$^7$ ............................ H05H 1/24; B05D 3/06; C23C 16/26
(52) U.S. Cl. .................... 427/535; 427/534; 427/249.1; 427/249.7; 427/577; 438/761; 438/783
(58) Field of Search ................. 427/534, 535, 427/536, 577, 562, 249.1, 249.7, 249.8; 438/780, 761, 783

(56) References Cited

U.S. PATENT DOCUMENTS

| | | | | |
|---|---|---|---|---|
| 5,418,018 A | * | 5/1995 | Rudder et al. | 427/579 |
| 5,601,883 A | * | 2/1997 | Yamazaki | 427/577 |
| 5,804,259 A | * | 9/1998 | Robles | 427/577 |
| 5,946,601 A | * | 8/1999 | Wong et al. | 438/783 |
| 6,030,904 A | * | 2/2000 | Grill et al. | 438/781 |
| 6,048,786 A | * | 4/2000 | Kudo | 438/780 |
| 6,054,398 A | * | 4/2000 | Pramanick | 438/784 |
| 6,136,386 A | * | 10/2000 | Nakahigashi et al. | 427/536 |
| 6,150,258 A | * | 11/2000 | Mountsier et al. | 438/780 |
| 6,323,119 B1 | * | 11/2001 | Xi et al. | 427/577 |
| 2001/0029110 A1 | * | 10/2001 | Lee et al. | 438/780 |

FOREIGN PATENT DOCUMENTS

| | | |
|---|---|---|
| JP | 6-333916 | 12/1994 |
| JP | 8-64591 | 3/1996 |
| JP | 10-214829 | 8/1998 |

OTHER PUBLICATIONS

K. Murata et al., In Japanese with English abstract "STM/STS Analysis of Diamond FIlms Prepared by OH Radical Injection", Papers of Meetings of IEEJ, Meeting Dielectric and Electrical Insulating Materials, DEI–97–1–9, pp. 1–6, (1997), no month G. Francz et al., "Photoelectron Spectroscopy of Ion–Irradiated B–Doped CVD Diamond Surfaces", Thin Solid Films, vol. 270, pp. 200–204, (1995).

* cited by examiner

*Primary Examiner*—Marianne Padgett
(74) *Attorney, Agent, or Firm*—Finnegan, Henderson, Farabow, Garrett & Dunner LLP

(57) ABSTRACT

In a case where a CF film is used as an interlayer dielectric film for a semiconductor device, when a wiring of tungsten is formed, the CF film is heated to a temperature of, e.g., about 400 to 450° C. At this time, a F gas is released from the CF film, so that there are various disadvantages due to the corrosion of the wiring and the decrease of film thickness. In order to prevent this, thermostability is enhanced.

A compound gas of C and F, e.g., $C_4F_8$ gas, and a hydrocarbon gas, e.g., $C_2H_4$ gas, are used as thin film deposition gases. These gases are activated as plasma to deposit a CF film on a semiconductor wafer 10 using active species thereof. Then, a hydrogen plasma producing gas, e.g., $H_2$ gas, is introduced to be activated as plasma, and the CF film deposited on the wafer 10 is irradiated with the H plasma. Since the unreacted F and weak bonds existing in the CF film are removed by the irradiation of the H plasma, the bonds are strengthen, and the bonds are difficult to be cut even at a high temperature, so that thermostability is improved.

8 Claims, 6 Drawing Sheets

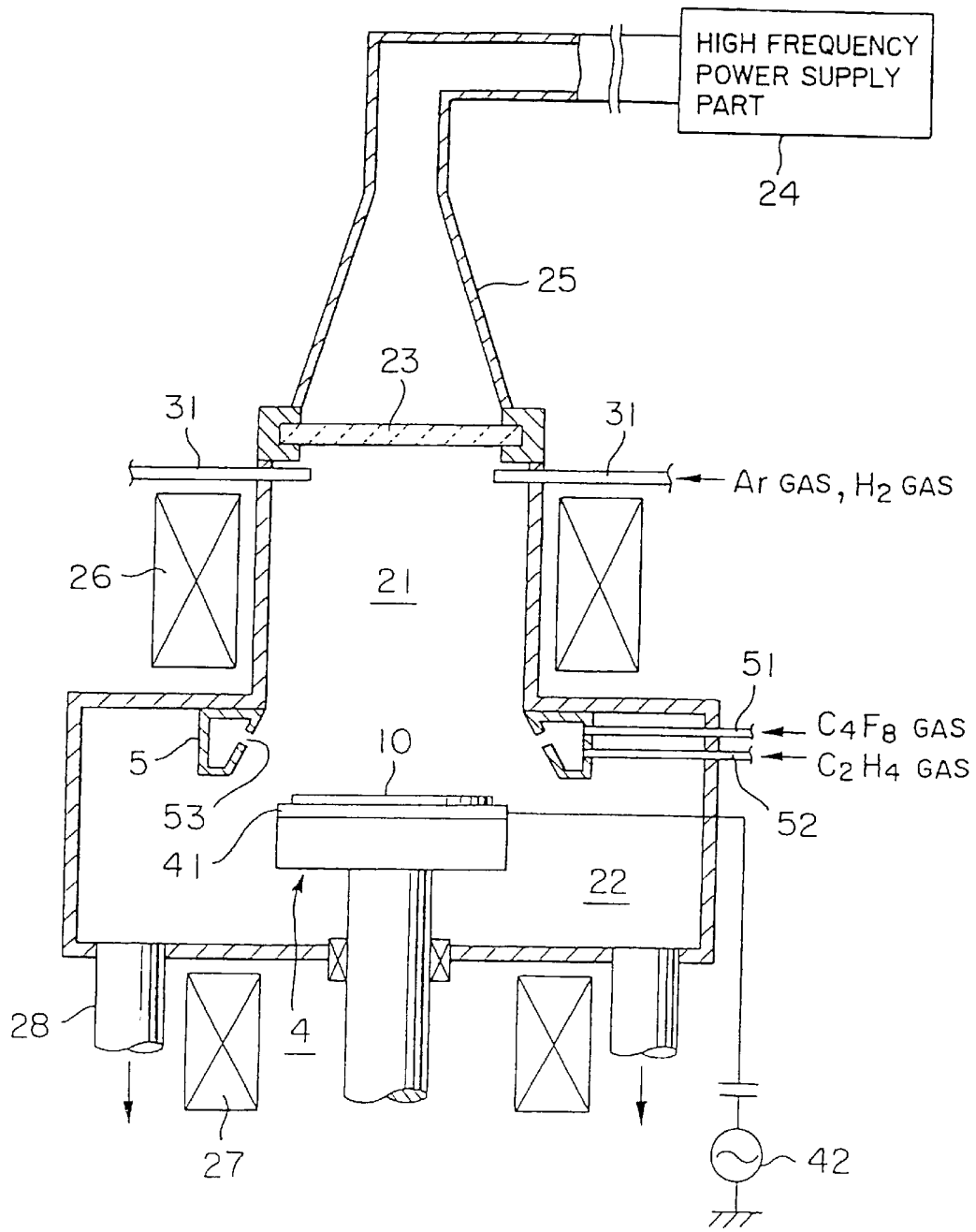
F I G. 1

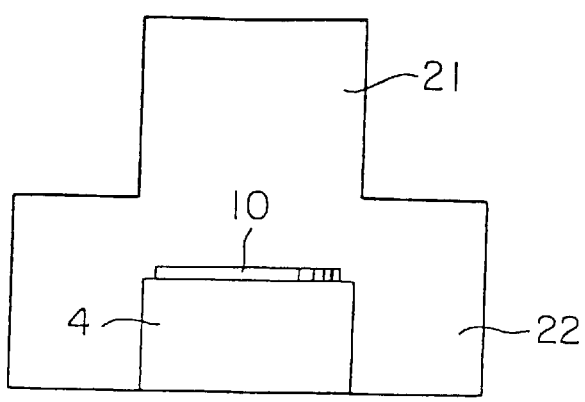
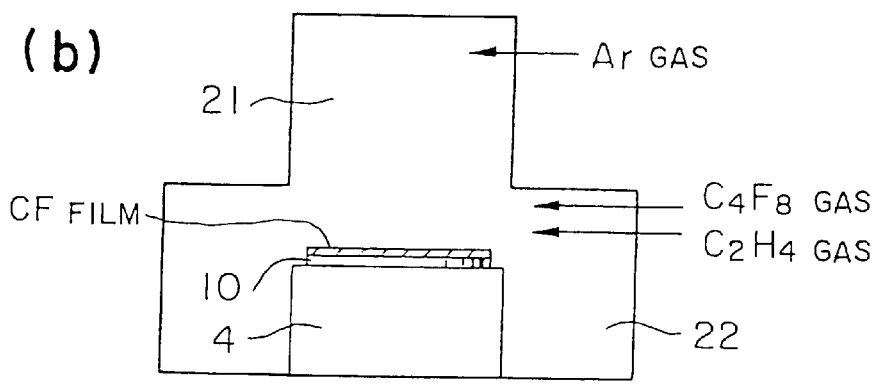
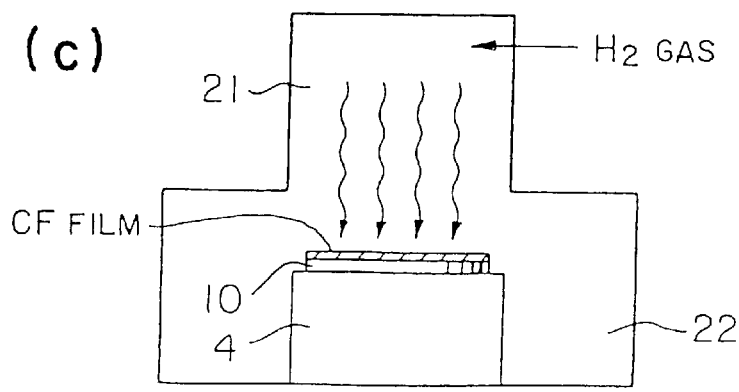
F I G. 2

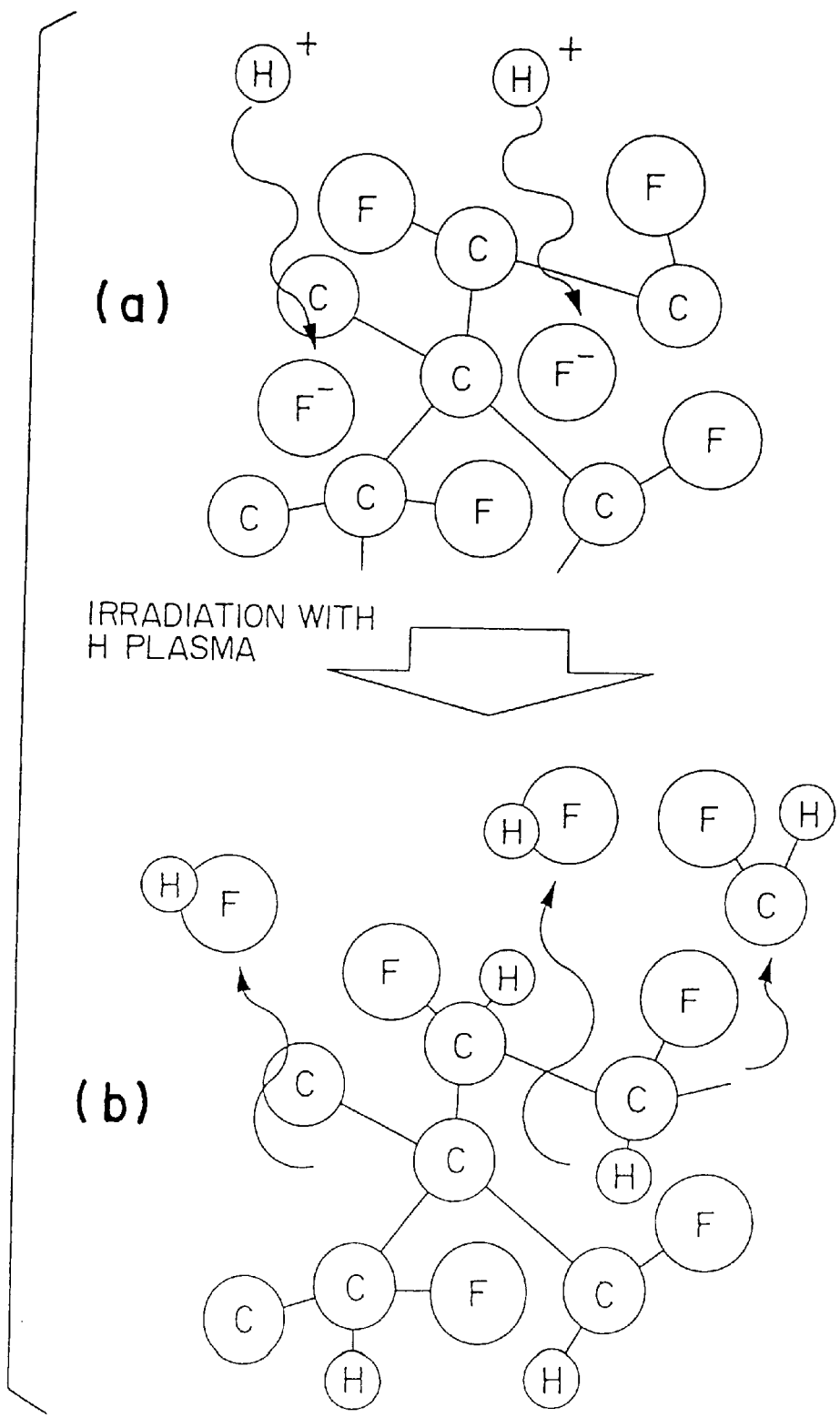
F I G. 3

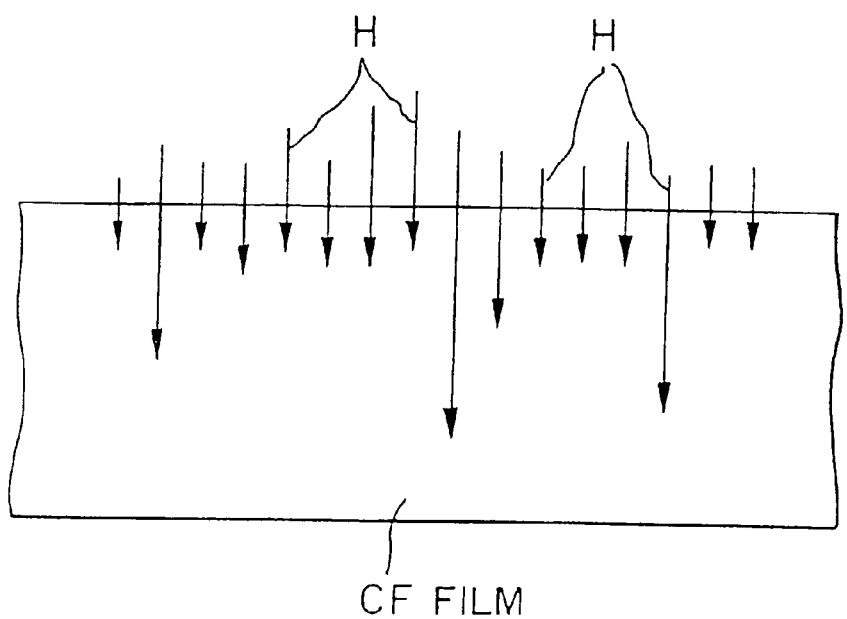
F I G. 4
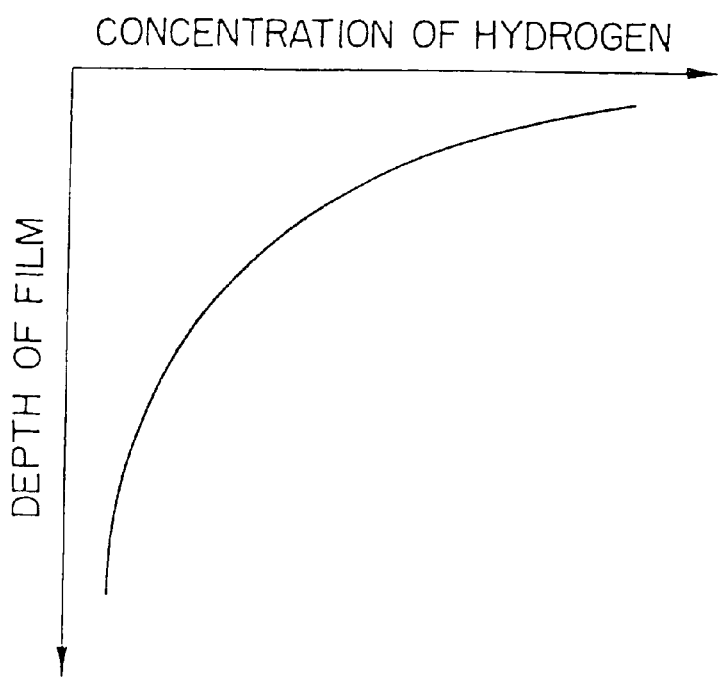
F I G. 5

| | H PLASMA IRRA-DIATION TIME (sec.) | VARIATION IN WEIGHT (%) |
|---|---|---|
| EXAMPLE 1 | 15 | 2.63 |
| EXAMPLE 2 | 30 | 1.65 |
| COMPARATIVE EXAMPLE | 0 | 4.02 |

PLASMA TREATMENT METHOD

This application is a continuation of International Application No. PCT/JP98/04932, filed Oct. 30, 1998, the content of which is incorporated herein by reference.

TECHNICAL FIELD

The present invention relates to a plasma treatment method for enhancing the thermostability of a fluorine containing carbon film capable of being used as, e.g., an interlayer dielectric film of a semiconductor device.

BACKGROUND ART

In order to increase the integration of a semiconductor device, it has been developed to provide devices, such as the scale down of a pattern and the multilayering of a circuit. As one of such devices, there is a technique for multilayering wirings. In order to provide a multilevel interconnection structure, a number n wiring layer and a number (n+1) wiring layer are connected to each other by means of a conductive layer, and a thin film called an interlayer dielectric film is formed in a region other than the conductive layer.

A typical interlayer dielectric film is an $SiO_2$ film. In recent years, in order to more accelerate the operation of a device, it has been required to reduce the relative dielectric constant of the interlayer dielectric film, and the material of the interlayer dielectric film has been studied. That is, the relative dielectric constant of an $SiO_2$ film is about 4, and it has been diligently studied to dig up materials having a smaller relative dielectric constant than that of the $SiO_2$ film. As one of such materials, it has been studied to put an SiOF film having a relative dielectric constant of 3.5 into practice. The inventor has taken notice of a fluorine containing carbon film (which will be hereinafter referred to as a "CF film") having a still smaller relative dielectric constant. The CF film is deposited by means of, e.g., the thermal CVD (Chemical Vapor Deposition) or the plasma CVD.

Therefore, the inventor has intended to provide a CF film having high adhesion and hardness using a plasma system for producing a plasma by the electron cyclotron resonance, using gases containing, e.g., a compound gas of carbon (C) and fluorine (F) and a hydrocarbon gas as thin film deposition gases, on various process conditions.

However, the CF film has the following problems. FIG. 8 shows a part of a circuit part formed on a wafer, wherein reference numbers 11 and 12 denote CF films, 13 and 14 denoting conductive layers of tungsten (W), 15 denoting a conductive layer of aluminum (Al), 16 denoting an $SiO_2$ film, into which P and B are doped, and 17 denoting an n-type semiconductor region. The W layer 13 is formed at a process temperature of 400 to 450° C. At this time, the CF films 11 and 13 are heated to the process temperature. However, if the CF films are heated to such a high temperature, a part of C—F bonds are cut, so that F gases are mainly released. The F gasses include F, CF, $CF_2$ gases and so forth.

Thus, if the F gases are released, there are the following problems.

(a) The metal wirings of aluminum, tungsten and so forth are corroded.
(b) Although the insulator film also has the function of pressing the aluminum wiring to prevent the swell of ahlminum, the pressing force of the insulator film on the aluminum wiring is decreased by the degassing. As a result, the aluminum wiring swells, so that an electrical defect called electromigration is easily caused.
(c) The insulator film cracks, so that the insulation performance between the wirings gets worse. When the extent of the crack increases, it is not possible to form a wiring layer at the next stage.
(d) If the amount of released F increases, the relative dielectric constant increases.

DISCLOSURE OF THE INVENTION

It is therefore an object of the present invention to eliminate the aforementioned problems and to provide a plasma treatment method capable of forming an insulator film of a CF film, which has strong bonds and high thermostability, e.g., an interlayer dielectric film of a semiconductor device.

According to one aspect of the present invention, a plasma treatment method comprises the steps of: activating a hydrogen plasma producing gas to form a hydrogen plasma; and irradiating a fluorine containing carbon film, which is formed on a substrate to be treated, with the hydrogen plasma.

According to another aspect of the present invention, a plasma treatment method comprises the steps of: decomposing a thin film deposition gas containing a compound gas of carbon and fluorine, to deposit a fluorine containing carbon film on a substrate to be treated, by a chemical gaseous phase reaction; and activating a hydrogen plasma producing gas to form a hydrogen plasma to irradiate the fluorine containing carbon film, which is deposited on the substrate, with the hydrogen plasma. Preferably, the thin film deposition gas includes a hydrocarbon gas.

The hydrogen plasma producing gas is preferably $H_2$ gas or $NH_3$ gas.

According to the present invention, it is possible to provide a CF film which has high thermostability and a small amount of released F gases. Therefore, if this CF film is used as, e.g., an interlayer dielectric film of a semiconductor device, it is possible to prevent the corrosion of metal wirings and to prevent the production of cracks and the swell of aluminum wirings. Since it is required to scale semiconductor devices down and to accelerate the operation of semiconductor devices and since CF films are noticed as effective insulator films having a small relative dielectric constant, the method of the present invention is effective to use CF films as insulator films.

BRIEF DESCRIPTION OF THE DRAWINGS

FIG. 1 is a longitudinal section of an example of a plasma treatment system for carrying out a method according to the present invention;

FIG. 2 is a schematic diagram showing the steps of the preferred embodiment of the present invention;

FIG. 3 is a schematic diagram for explaining the operation of the preferred embodiment of the present invention;

FIG. 4 is a schematic diagram showing the state of H entering a CF film;

FIG. 5 is a graph showing the relationship between the depth of a CF film and the concentration of hydrogen;

BEST MODE FOR CARRYING OUT THE INVENTION

Figure 6:
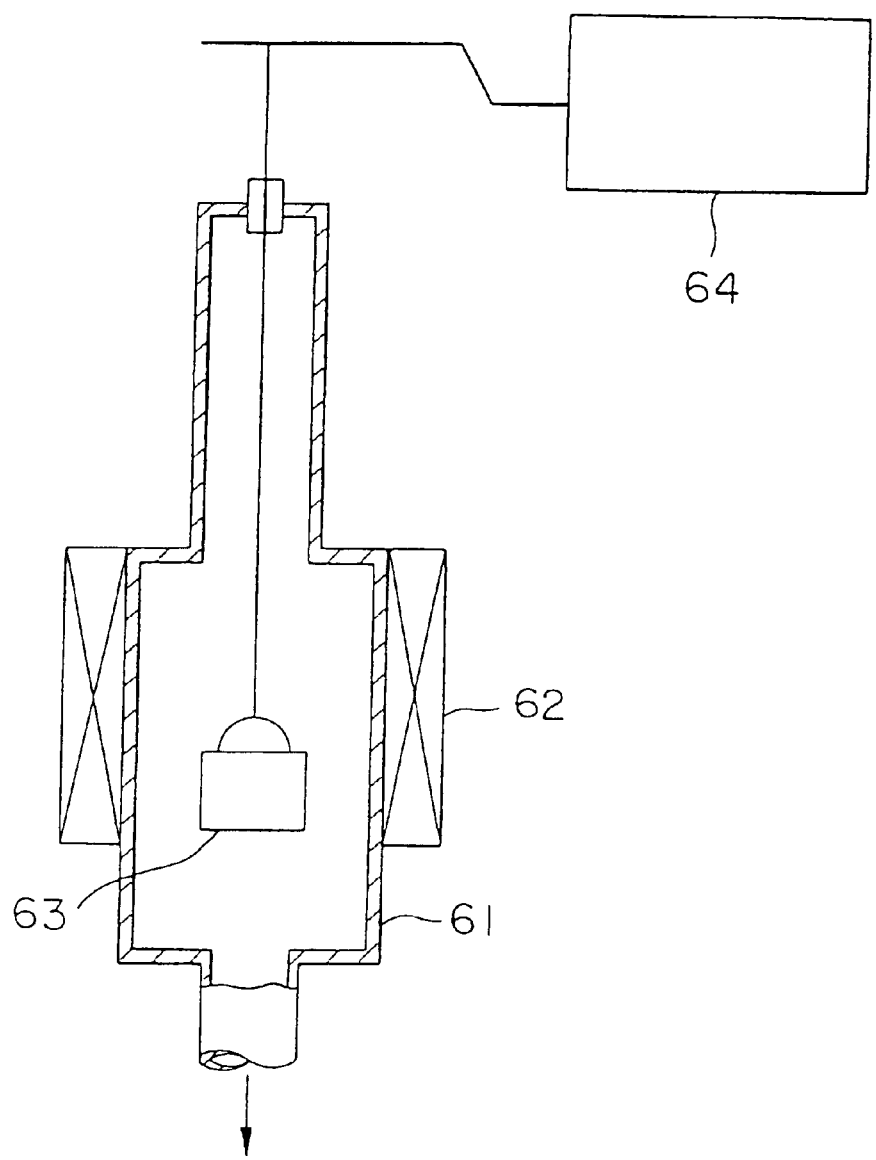
FIG. 6 is a schematic sectional view showing a measuring device for examining the variation in weight of a thin film.

FIG. 1 shows an example of a plasma treatment system for use in the preferred embodiment of the present invention. This system has a vacuum vessel 2 of, e.g., aluminum. The vacuum vessel 2 comprises a first cylindrical vacuum chamber 21, which is arranged in an upper portion for producing a plasma, and a second cylindrical vacuum chamber 22, which is communicated with and connected to the lower portion of the first vacuum chamber 21 and which has a greater diameter than that of the first vacuum chamber 21. Furthermore, the vacuum vessel 2 is grounded to have a zero potential.

The upper end of the vacuum vessel 2 is open. A transmission window 23 of a microwave permeable material, e.g., quartz, is airtightly provided in the open upper end of the vacuum vessel 2 to as to hold vacuum in the vacuum vessel 2. Outside of the transmission window 23, a waveguide 25 connected to a high-frequency power supply part 24 for producing a microwave of, e.g., 2.45 GHz, is provided. The microwave produced by the high-frequency power supply part 24 is guided by the waveguide 25 in, e.g., a TE mode, or the microwave guided in the TE mode is converted by the waveguide 25 into a TM mode, to be introduced from the transmission window 23 into the first vacuum chamber 21.

In the side wall defining the first vacuum chamber 21, gas nozzles 31 are arranged at regular intervals along, e.g., the periphery thereof. The gas nozzles 31 are connected to a plasma producing gas source (not shown), e.g., an Ar gas source, and a hydrogen plasma producing gas source (not shown), e.g., an $H_2$ (hydrogen) gas source, so that a plasma producing gas, e.g., Ar gas or $H_2$ gas, can be uniformly supplied to the upper portion in the first vacuum chamber 21.

In the second vacuum chamber 22, a mounting table 4 for a semiconductor wafer (which will be hereinafter referred to as a "wafer") is provided so as to face the first vacuum chamber 21. The mounting table 4 has an electrostatic chuck 41 on the surface thereof. The electrode of the electrostatic chuck 41 is connected to a dc power supply (not shown) for absorbing the wafer and to a high-frequency power supply part 42 for applying a bias voltage for implanting ions into the wafer.

On the other hand, in the upper portion of the second vacuum chamber 22, i.e., in a portion of the second vacuum chamber 22 communicated with the first vacuum chamber 21, a ring-shaped deposition gas supply part 5 is provided. Two kinds of thin film deposition gases, which includes a compound gas of C and F, e.g., $C_4F_8$ gas, and a hydrocarbon gas, e.g., $C_2H_4$ gas, are supplied from gas supply pipes 51 and 52 to the deposition gas supply part 5, so that the mixed gas thereof is supplied to the vacuum vessel 2 via gas holes 53 formed in the inner peripheral surface of the deposition gas supply part 5.

In the vicinity of the outer periphery of the side wall defining the first vacuum chamber 21, a magnetic field forming means, e.g., a ring-shaped main electromagnetic coil 26, is arranged. Below the second vacuum chamber 22, a ring-shaped auxiliary electromagnetic coil 27 is arranged. To the bottom of the second vacuum chamber 22, exhaust pipes 28 are connected at, e.g., two positions which are symmetrical with respect to the central axis of the vacuum chamber 22.

Referring to FIGS. 2(a) through 2(c), a method for forming an interlayer dielectric film of a CF film on the wafer 10 serving as a substrate to be treated, by means of the above described system.

First, as shown in FIG. 2(a), a gate value (not shown) provided in the side wall of the vacuum vessel 2 is open, and the wafer 10, on which, e.g., an aluminum wiring has been formed, is introduced from a load-lock chamber (not shown) by means of a transport arm (not shown) to be mounted on the mounting table 4 to be electrostatically absorbed by means of the electrostatic chuck 41.

Subsequently, after the gate value is closed to seal the interior of the vacuum vessel 2, the internal atmosphere is exhausted by the exhaust pipes 28, and the interior of the vacuum vessel 2 is evacuated to a predetermined degree of vacuum. Then, as shown in FIG. 2(b), Ar gas is introduced from the gas nozzles 31 into the first vacuum chamber 21 at a predetermined flow rate, and a thin film deposition gas is introduced from the deposition gas supply part 5 into the second vacuum chamber 22 at a predetermined flow rate. Then, the interior of the vacuum vessel 2 is held at a predetermined process pressure, and a bias voltage of 13.56 MHz and 1500 W is applied to the mounting table by means of the high-frequency power supply part 42. In addition, the surface temperature of the mounting table 4 is set to be about 300° C.

On the other hand, a high-frequency wave (a microwave) of 2.45 GHz and 2700 W from the high-frequency power supply part 24 passes through the waveguide 25 to reach the ceiling of the vacuum vessel 2, and passes through the transmission window 23 to be introduced into the first vacuum chamber 21. In the vacuum vessel 2, a magnetic field extending from the upper portion of the first vacuum chamber 21 to the lower portion of the second vacuum chamber 22 is formed by the main electromagnetic coil 26 and the auxiliary electromagnetic coil 27, so that the intensity of the magnetic field is, e.g., 875 gausses in the vicinity of the lower portion of the first vacuum chamber 21. Thus, the electron cyclotron resonance is produced by the interaction between the magnetic field and the microwave, so that Ar gas is activated as plasma and enriched. The produced plasma flows from the first vacuum chamber 21 into the second vacuum chamber 22 to activate $C_4F_8$ gas and $C_2H_4$ gas (as plasma), which have been supplied thereto, to form active species (plasma) to deposit a CF film on the wafer 10.

After the CF film is thus deposited on the wafer 10, the wafer 10 is irradiated with H plasma as a kind of a post-treatment as shown in FIG. 2(c).

That is, while the wafer 10 is put on the mounting table 4, $H_2$ gas is introduced from the gas nozzles 31 at a predetermined flow rate to be activated at a microwave power (the high-frequency power supply part 24) of 5000 W and at a bias power (the high-frequency power supply part 42) of 0 W by the aforementioned electron cyclotron resonance to produce H plasma. Thus, the CF film on the wafer 10 is irradiated with the H plasma Furthermore, when a device is actually produced, the CF film is etched with a predetermined pattern, and, e.g., a W film is embedded in a groove portion to form a W wiring.

The CF film thus formed has a strong bond, and a high thermostability as can be seen from the experimental results which will be described later. As a result, the amount of the released F gases is small even at a high temperature.

It is considered that the reason for this is as follows. That is, if a CF gas and a hydrocarbon gas are combined as a thin film deposition gas to deposit a CF film, it is considered that the CF film includes C—C bonds, C—F bonds and C—H bonds as well as an unreacted F, F ion (F$^-$) and so forth as shown in FIG. 3(a).

As this preferred embodiment, if the CF film is irradiated with the H plasma, the H penetrates into the interior of the CF film from the surface thereof as shown in FIG. 4 since H atom is minute. However, since the amount of H capable of reaching the deep layer portion of the CF film is very small, the concentration of H in the CF film is low in the deep layer portion and high in the surface layer portion as shown in FIG. 5.

By the way, it is considered that the H penetrating into the CF film reacts with the unreacted F in the CF film as shown in FIG. 3(b) to produce HF, and/or cuts C—F bonds having a weak bonding strength to produce HF and/or CHF to be scattered to the outside of the CF film. At this time, a part of the unreacted F and so forth in the CF film are removed by the H penetrating into the deep layer portion. On the other hand, in the surface layer portion, the concentration of H is high, and the amount of H capable of reacting with the unreacted F and so forth is large, so that the unreacted F and so forth are sufficiently removed. As a result, strong bonds remain, so that the film becomes strong.

The release of F gasses is caused if the unreacted F, and F, CF and $CF_2$, which are produced by cutting C—C bonds by heat during a heat treatment at a high temperature, are scattered. Therefore, if the unreacted F is previously removed by the H plasma, it is possible to prevent F gasses from being released.

In addition, as described above, if the surface layer portion is strengthen by the irradiation with the H plasma, the C—C bonds in that portion are difficult to be cut even at a high temperature, so that the release of F gases from the surface layer portion is inhibited. Moreover, even if the unreacted F remains in the film or weak C—C bonds are cut, the strong film in the surface layer portion serves as a barrier to inhibit the F gases from permeating. Therefore, the degassing of these gasses is inhibited even during a heat treatment at a high temperature. Thus, thermostability of the CF film is improved.

Experiments, which were carried out in order to examine thermostability of a CF film formed by the method of the present invention, will be described below.

The plasma treatment system shown in FIG. 1 was used, and Ar gas of 150 sccm, $C_4F_8$ gas of 40 sccm and $C_2H_4$, gas of 30 sccm were introduced to deposit a CF film of 2 $\mu$m on the wafer 10. At this time, the microwave power and the bias power were 2700 W and 1500 W, respectively. In addition, the temperature of the surface of the mounting table 4 was 300° C., and the process pressure was 0.2 Pa. Then, $H_2$ gas of 300 sccm was introduced to be activated as plasma, and the CF film on the wafer 10 was irradiated with the H plasma for 15 seconds. At this time, the microwave power and the bias power were 5000 W and 0 W, respectively. In addition, the temperature of the surface of the mounting table 4 was 300° C., and the process pressure was 1 Pa (Example 1).

With respect to the CF film thus deposited, the variation in weight at a high temperature serving as an index of the thermostability of a thin film was examined by means of a measuring device shown in FIG. 6. In FIG. 6, reference number 61 denotes a vacuum vessel, 62 denoting a heater, 63 denoting a crucible suspended from a beam of a light balance mechanism, and 64 denoting a weight measuring part As a measuring method, a method for shaving the CF film on the wafer to put the shaven CF film in the crucible 63 to raise the temperature of the crucible 63 to 425° C. under the atmosphere of He to heat the CF film for 2 hours to examine the variation in weight in the weight measuring part 64 was adopted.

The variation in weight means a value of $\{(A-B)/A\} \times 100$ assuming that the weight of the thin film in the crucible before heating is A and the weight of the thin film in the crucible after heating is B. When this value is small, the amount of the released F gasses is small, and thermostability is high.

The variation in weight was measured when a CF film was deposited on the wafer 10 on the same conditions as those in Example 1 to activate $H_2$ gas as plasma on the same conditions as those in Example 1 to irradiate the CF film on the wafer 10 with the H plasma for 30 seconds (Example 2), and when a CF film was deposited on the wafer 10 on the same conditions as those in Example 1 without irradiating with the H plasma (Comparative Example). Furthermore, thermostability can be examined by the measurement of the degassing amount using the thermal disorption spectroscopy (TDS) spectrum, the variation in thickness in the heat treatment, and so forth.

Figures 7, 8:
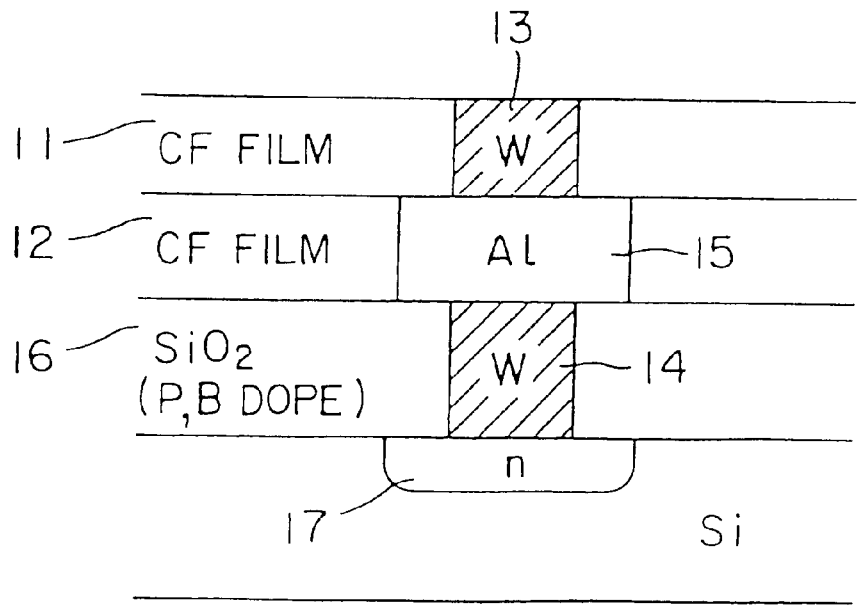
FIG. 7 is a table showing the relationship between the irradiation with H plasma and the variation in weight of a CF film.
FIG. 8 is a structural drawing showing an example of the structure of a semiconductor device.

These results are shown in FIG. 7. Thus, it is understood that the variation in weight of the CF film decreases and the amount of the released F gasses decreases to enhance thermostability when the CF film is irradiated with the H plasma, and that the variation in weight of the CF film decreases and thermostability increases as the irradiation time with the H plasma increases.

As the thin film deposition gases, compound gases of C and F, such as $CF_4$, $C_2F_6$, $C_3F_8$, $C_5F_8$ and $C_6F_6$ gases, as well as gases containing C, F and H, such as $CHF_3$ gas, may be used. Also, as the thin film deposition gases, hydrocarbon gases, such as $CH_4$, $C_2H_2$, $C_2H_6$, $C_3H_8$ and $C_4H_8$ gases, may be used. Hydrogen gas may be substituted for the hydrocarbon gas. The hydrogen plasma producing gases include gases, such as $H_2$ and $NH_3$ gases, which can produce H plasma and which deposit no thin film on the wafer. The hydrogen plasma producing gases also include $H_2O$, $H_2O_2$, HF, HCl and HBr.

According to the present invention, the method for depositing the CF film should not be limited to the plasma CVD, the CF film may be deposited by the thermal CVD. In addition, according to the present invention, the method for producing plasma should not be limited to the ECR, the plasma may be produced by, e.g., a method called ICP (Inductive Coupled Plasma) for applying electric and magnetic fields to a process gas from a coil wound onto a dome-shaped container. Moreover, the present invention may be applied to the case where a plasma called a helicon wave plasma is produced by the interaction between a helicon wave of, e.g., 13.56 MHz, and a magnetic field applied by a magnetic coil, the case where a plasma called a magnetron plasma is produced by applying a magnetic field substantially in parallel to two parallel cathodes, and the case where a plasma is produced by applying a high frequency power between electrodes called parallel plates, which face each other in parallel.

Moreover, according to the present invention, only a step of irradiating with hydrogen plasma may be carried out without carrying out a thin film deposition step, or the thin film deposition step and the hydrogen plasma irradiating step may be repeated.

What is claimed is:

1. A plasma treatment method for treating a fluorine-containing carbon film serving as an interlayer dielectric film in a semiconductor device having a multilevel interconnection structure with metal wirings, comprising:

activating a plasma-producing gas containing hydrogen to form a hydrogen plasma; and irradiating the fluorine-containing carbon film formed on a surface of the multilevel interconnection structure with the metal wirings with said hydrogen plasma, wherein hydrogen reacts with fluorine in the fluorine-containing carbon film to increase thermostability of the fluorine-containing carbon film.

2. A plasma treatment method as set forth in claim 1, wherein said plasma-producing gas is selected from a group consisting of $H_2$ gas, $NH_3$ gas, $H_2O$, $H_2O_2$, HF, HCl, HBr and mixtures thereof.

3. A plasma treatment method for treating an interlayer dielectric film of a semiconductor device having a multilevel interconnection structure, comprising:

decomposing a thin film deposition gas containing a compound gas of carbon and fluorine to deposit a fluorine-containing carbon film on a surface of the multilevel interconnection structure having metal wirings by a chemical gaseous phase reaction;

after depositing the fluorine-containing carbon film on the substrate, introducing a plasma-producing gas containing hydrogen;

activating the plasma-producing gas to form a hydrogen plasma; and irradiating said fluorine-containing carbon film serving as the interlayer dielectric film deposited on said substrate with said hydrogen plasma, wherein hydrogen reacts with fluorine in the fluorine-containing carbon film to increase thermostability of the fluorine-containing carbon film.

4. A plasma treatment method as set forth in claim 3, wherein said thin film deposition gas includes a hydrocarbon gas.

5. A plasma treatment method as set forth in claim 3, wherein said plasma-producing gas is selected from a group consisting of $H_2$ gas, $NH_3$ gas, $H_2O$, $H_2O_2$, HF, HCl, HBr and mixtures thereof.

6. A plasma treatment method as set forth in claim 3, wherein depositing said fluorine-containing carbon film is performed by the plasma chemical vapor deposition.

7. A plasma treatment method as set forth in claim 3, wherein depositing said fluorine-containing carbon film is performed by the thermal chemical vapor deposition.

8. A plasma treatment method as set forth in claim 3, wherein depositing said fluorine-containing carbon film and irradiating said fluorine-containing carbon film with said hydrogen plasma are alternately repeated at least once.

\* \* \* \* \*